United States Patent [19]
Chew et al.

[11] Patent Number: 5,973,388
[45] Date of Patent: Oct. 26, 1999

[54] LEADFRAME, METHOD OF MANUFACTURING A LEADFRAME, AND METHOD OF PACKAGING AN ELECTRONIC COMPONENT UTILIZING THE LEADFRAME

[75] Inventors: Chee Hiong Chew, Negeri Sembilan; Hin Kooi Chee, Seremban; Saat Shukri Embong, Senawang Seremban, all of Malaysia

[73] Assignee: Motorola, Inc., Schaumburg, Ill.

[21] Appl. No.: 09/224,823

[22] Filed: Jan. 4, 1999

[30]     Foreign Application Priority Data

Jan. 26, 1998 [MY]   Malaysia ................. PI 980 0329

[51] Int. Cl.⁶ .................... H01L 23/495; H05K 5/02; H05K 7/18
[52] U.S. Cl. .................. 257/676; 257/666; 257/669; 257/672; 361/813
[58] Field of Search ................... 257/676, 666, 257/669, 672; 438/123; 361/813

[56]          References Cited

FOREIGN PATENT DOCUMENTS

| | | | |
|---|---|---|---|
| 54-140465 | 10/1979 | Japan | 257/674 |
| 56-62344 | 5/1981 | Japan | 257/674 |
| 59-222951 | 12/1984 | Japan | 257/674 |
| 61-224441 | 10/1986 | Japan | 257/676 |
| 1-186662 | 7/1989 | Japan | 257/674 |
| 1-289149 | 11/1989 | Japan | 257/676 |
| 1-289150 | 11/1989 | Japan | 257/676 |
| 4-364061 | 12/1992 | Japan | 257/666 |
| 4-368154 | 12/1992 | Japan | 257/666 |
| 5-109928 | 4/1993 | Japan | 257/669 |
| 6-21305 | 1/1994 | Japan | 257/669 |

*Primary Examiner*—Mahshid Saadat
*Assistant Examiner*—Jhihan B Clark
*Attorney, Agent, or Firm*—Rennie W. Dover

[57]          ABSTRACT

In order to package an electronic component, a leadframe is provided having at least one flag portion (2) and at least one lead portion (7) extending towards the flag portion (2). The lead portion (7) includes an end portion (10) of reduced thickness adjacent the flag portion (2) and a channel (9) between the end portion (10) and the rest of the lead portion. The leadframe is etched to form the channel (9) and the end portion(10), which together form a locking step. The electronic component (3) is then mounted on the flag portion (2) and electrically connected to the end of the lead portion (7). The electronic component (3), the electrical connection (5), at least the end portion (10) and the intermediate portion (9) of the lead portion (7) and at least part of the flag portion (2) are encapsulated in a plastics molding compound, which enters and fills the locking step, and is then cured.

7 Claims, 3 Drawing Sheets

LEADFRAME, METHOD OF MANUFACTURING A LEADFRAME, AND METHOD OF PACKAGING AN ELECTRONIC COMPONENT UTILIZING THE LEADFRAME

FIELD OF THE INVENTION

This invention relates to a method of packaging electronic components, especially, although not exclusively, components such as semiconductor devices, mounted on a leadframe, and to a method of manufacturing and the structure of such a leadframe.

BACKGROUND OF THE INVENTION

As is well known, in general, in a semiconductor chip package, a semiconductor die is mounted on a flag portion of a leadframe, and wires or connecting bridges electrically connect the die to inner ends of lead portions of the leadframe, the die, wires and the inner ends of the lead portions being encapsulated in plastic moulding compound to form the semiconductor chip package.

In high power plastic semiconductor chip packages, the bottom surface of the flag portion provides a heat sink for the semiconductor die; so it is not encapsulated in the moulding compound. Hence, encapsulation of the die, the wire bonds and the inner portions of the lead portions, without covering the bottom surface of the flag portion of the leadframe and without causing package integrity and delamination issues is critical. Package integrity and delamination are major concerns in electronic component packaging design. Moisture and/or ionic contamination from the atmosphere can sometimes penetrate through the junction of the plastic compound and the flag portion of the leadframe, which can cause reliability problems, i.e. a greatly reduced component operating life.

During the manufacturing process or under certain operating conditions, separation of the mold compound and the leadframe, or metal substrate carrier, on which the semiconductor device is mounted, may occur in some of the packages which have poor integrity, that is low adhesion between the mold compound and the substrate. Consequently, a gap may exist between the mold compound encapsulation and the leadframe. Moisture can then travel along the gap to the functional area of the electronic device. In the worst case, the plastic encapsulation might totally detach from the leadframe, leaving the electronic device completely exposed. This phenomenon is becoming more and more critical as the semiconductor industry moves towards packaging electronic devices in smaller and smaller packages.

Accordingly, a lot of effort has gone into trying to minimize the effect of or prolong the time for moisture diffusion to the area where the semiconductor die is mounted. In order to try to achieve this, additional features have been added to the leadframe substrate to try to provide both a barrier to moisture penetration and to enhance the "locking" between the mold compound and the substrate.

As shown in FIGS. 1 and 2, a known power plastic package is formed from a leadframe including a large flag portion 2, on which is mounted a semiconductor die 3. The semiconductor die 3 is electrically connected to inner ends 4 of the lead portions 8 using gold, copper or aluminium wires 5. The complete assembly is then encapsulated in an epoxy compound 1, except for the lower surface of the flag portion 2, which is left uncovered to provide a heat sink to dissipate heat from the die 3 to the external environment. Since the epoxy compound 1 does not cover the exposed heatsink, it cannot firmly lock to the leadframe.

As shown in FIG. 2, the lead portions 8 are bent downwards to facilitate soldering of the package to a printed circuit board. Thus, the inner ends 4 protrude towards the flag portion at a different level from the flag portion, thus allowing the epoxy compound to completely encapsulate the inner end 4 so as to improve the locking.

However, bending the leads requires a forming tool which must be designed and manufactured to form and stamp to the required precise leadframe downset dimension. This requires a considerable period of time (usually around 10–12 weeks), which delays introducing any changes into the leadframe design. An alternative is to use plastic or paper for rapid prototyping. However, this method does not provide functional parts that are capable of being used in early reliability testing of samples for customers.

BRIEF SUMMARY OF THE INVENTION

The present invention therefore seeks to provide a leadframe structure which overcomes, or at least reduces the above-mentioned problems of the prior art.

Accordingly, in a first aspect, the invention provides a leadframe having at least one flag portion and at least one lead portion extending towards the flag portion, the lead portion including an elongate portion, an end portion adjacent the flag portion and an intermediate portion interconnecting the end portion and the elongate portion, the thickness of the end portion being less than the thickness of the elongate portion and the thickness of the intermediate portion being less than the thickness of the end portion.

In a preferred embodiment, the end portion of the leadframe has a width greater than the elongate portion.

Preferably, the intermediate portion of the leadframe has a width greater than the elongate portion. Alternatively, the intermediate portion of the leadframe has a width substantially the same as the elongate portion.

The elongate portion of the leadframe preferably has a thickness substantially the same as that of the flag portion and is substantially coplanar therewith.

According to a second aspect, the invention provides a method of manufacturing a leadframe comprising the steps of providing a sheet of metal, stamping out of the sheet at least one flag portion connected to a first bar and at least one lead portion connected to a second bar and extending towards the flag portion, the first and second bars being interconnected by one or more tie-bars, the lead portion including an elongate portion, an end portion adjacent the flag portion and an intermediate portion interconnecting the end portion and the elongate portion, first etching the intermediate portion to a predetermined thickness, and second etching the intermediate portion and the end portion to final thicknesses, wherein the final thickness of the end portion is less than the thickness of the elongate portion and the final thickness of the intermediate portion is less than the final thickness of the end portion.

According to a third aspect, the invention provides a method of packaging an electronic component, the method comprising the steps of providing a leadframe having at least one flag portion and at least one lead portion extending towards the flag portion, the lead portion including an elongate portion, an end portion adjacent the flag portion and an intermediate portion interconnecting the end portion and the elongate portion, the thickness of the end portion being less than the thickness of the elongate portion and the thickness of the intermediate portion being less than the thickness of the end portion, mounting the electronic component on the flag portion, electrically connecting the electronic component with the end portion of the lead portion, encapsulating the electronic component, the electrical connection, at least the end portion and the intermediate portion of the lead portion and at least part of the flag portion in a plastics molding compound, and curing the plastics molding compound.

In a preferred embodiment, the step of providing a leadframe comprises the steps of providing a sheet of metal, stamping out of the sheet at least one flag portion connected to a first bar and at least one lead portion connected to a second bar and extending towards the flag portion, the first and second bars being interconnected by one or more tie-bars, the lead portion including an elongate portion, an end portion adjacent the flag portion and an intermediate portion interconnecting the end portion and the elongate portion, first etching the intermediate portion to a predetermined thickness, and second etching the intermediate portion and the end portion to final thicknesses, so that the final thickness of the end portion is less than the thickness of the elongate portion and the final thickness of the intermediate portion is less than the final thickness of the end portion.

BRIEF DESCRIPTION OF THE DRAWINGS

One embodiment of the invention will now be more fully described, by way of example, with reference to the drawings, of which.

DETAILED DESCRIPTION OF THE DRAWINGS

Figure 1:
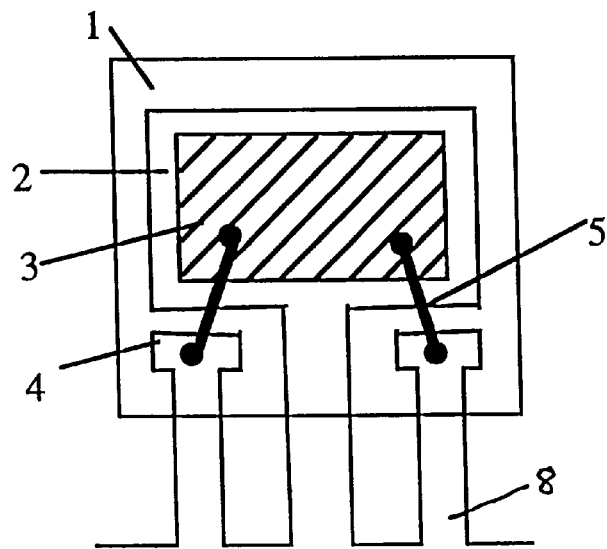
FIG. 1 shows a top view of a known discrete power plastic package.
Figure 2:
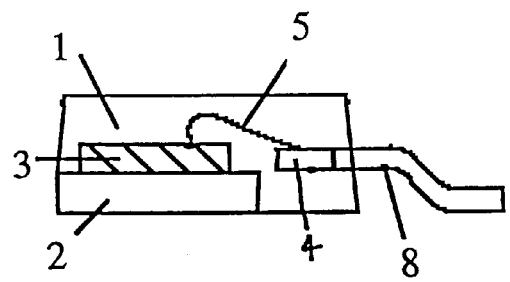
FIG. 2 shows a side view of the package of FIG. 1.
Figure 3:
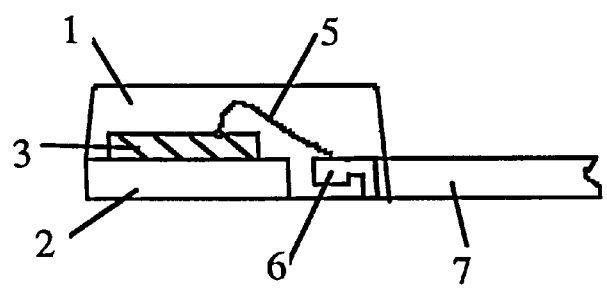
FIG. 3 shows one embodiment of a discrete power package according to one embodiment of the present invention.

Thus, as best shown in FIG. 3, a leadframe according to one embodiment of the present invention has a flag portion 2 providing a heatsink and lead portions 7, which are generally coplanar with the flag portion 2. A semiconductor die 3 is attached to the heatsink 2 by solder material or electrical conductive epoxy (not shown) and the die 3 is electrically connected to the inner ends 6 of the lead portions 7, as before, using wire bonds 5. The assembly is then encapsulated in an epoxy plastic compound, in a well known fashion.

In this embodiment of the leadframe, however, there is no bending of the lead portions. Instead, the inner ends 6 of the lead portions 7 are chemically etched to provide a locking structure for the epoxy compound, which enable the leads to obtain sufficient z direction locking without having to downset the leadframe.

Figure 4:
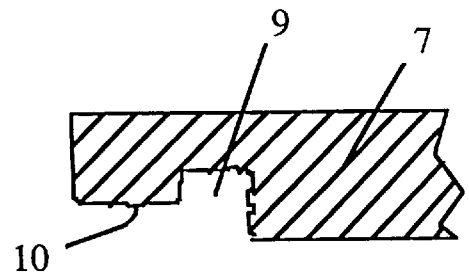
FIG. 4 shows an enlarged cross-sectional view of the inner end of a lead of the embodiment of FIG. 3.

FIG. 4 shows the structure of the inner end 6 of one lead portion 7 in more detail. The end 6 of the lead portion 7 is provided with a transverse channel 9 and the part 10 of the inner end 6 between the channel 9 and the end of the lead portion 7 is of reduced thickness to enable the mold compound to flow between the flag portion and the inner end 6 of the lead portion 7, around both sides of the reduced thickness portion 10 and into the channel 9, as best seen in FIG. 3, to provide the locking. During the curing process, the mold compound shrinks and imposes tension stress on the channel 9. Thus the leads are held in position by the hardened mold compound.

Figure 5:
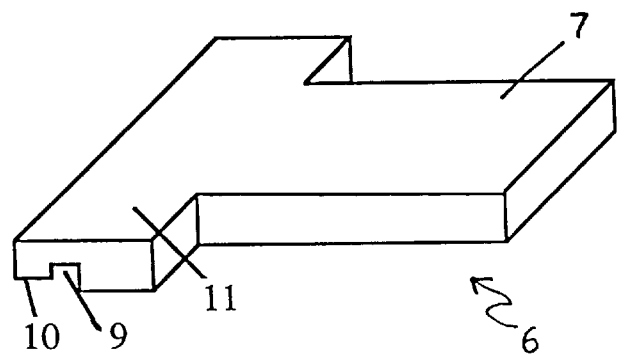
FIG. 5 shows a top isometric view of the lead of FIG. 4.
Figure 6:
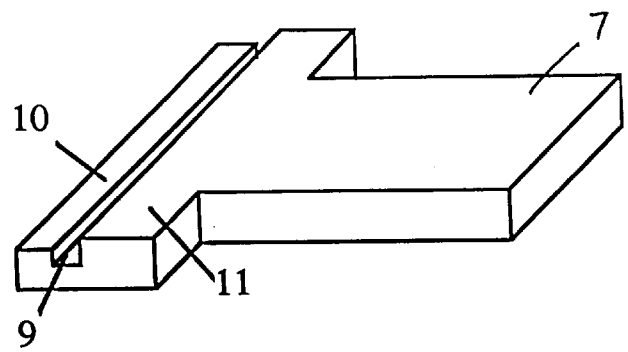
FIG. 6 shows a bottom isometric view of the lead of FIG. 4.
Figure 7:
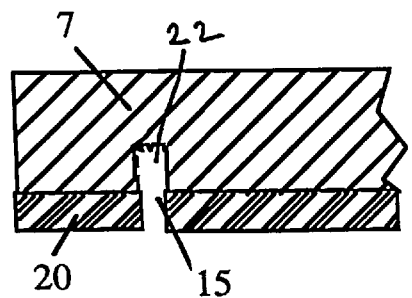
FIGS. 7 to 9: show various steps in the fabrication process of the inner end of the lead of the embodiment of FIG. 3.

FIGS. 5 and 6 show upper and lower perspective views of one example of a typical T-lead commonly found in multi-lead packages. The T-lead structure 11 at the end of the lead portion 7 provides a locking effect in directions parallel and perpendicular to the elongate lead portion 7. By providing the channel 9 and reduced thickness end 10 to the T-lead 11, the locking effect in the direction parallel to the lead portion 7 is enhanced.

In order to produce the reduced thickness portion 10 and the channel 9, the material on the lower side of the T-lead 11 (as shown in FIGS. 3, 4 and 5) is etched away in a 2 step chemical etching process. Firstly masks made of a material unaffected by the etching substance to be used (e.g. rubber) are fabricated according to the desired patterns of the leadframe. Openings are cut for areas to be etched. As shown in FIG. 6, a mask 20 is provided with a small opening 15 running along the width of the T-lead 11 in the position where the channel 9 is to be formed. The mask 20 is then pressed onto the leadframe. The leadframe with the mask 20 thereon is then passed through or dipped into the chemical etching solution. The solution etches away the leadframe material and creates a small transverse groove 22 in the lead portion 7.

Figure 8:
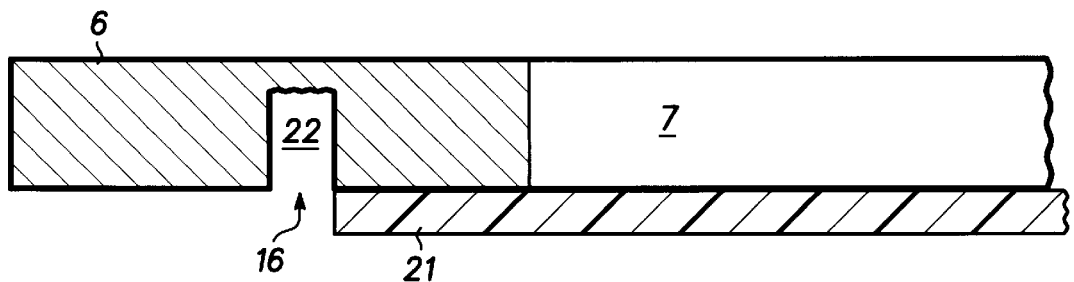
Figure 9:
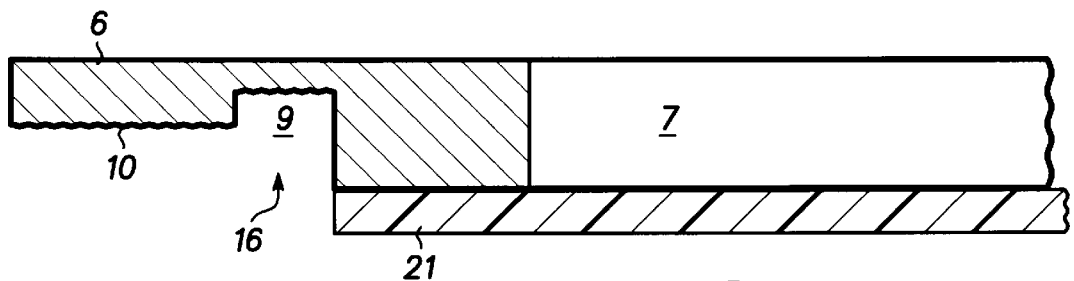

For the second etching step, as shown in FIG. 8, another mask 21 is produced, which has a larger opening 16 formed therein at the position where the reduced thickness portion 10 and the channel 9 are to be formed. This second mask 21 is then pressed onto the leadframe. Together with the second mask 21, the leadframe is then again passed through the chemical etching solution. The small hole 16 is enlarged by the second etching process to form the desired channel 9. At the same time, the reduced thickness portion 10 is formed, as shown in FIG. 9. The depth and width of the channel 9 and portion 10 can be controlled by the etching time and the concentration of the chemical solution.

Figure 10:
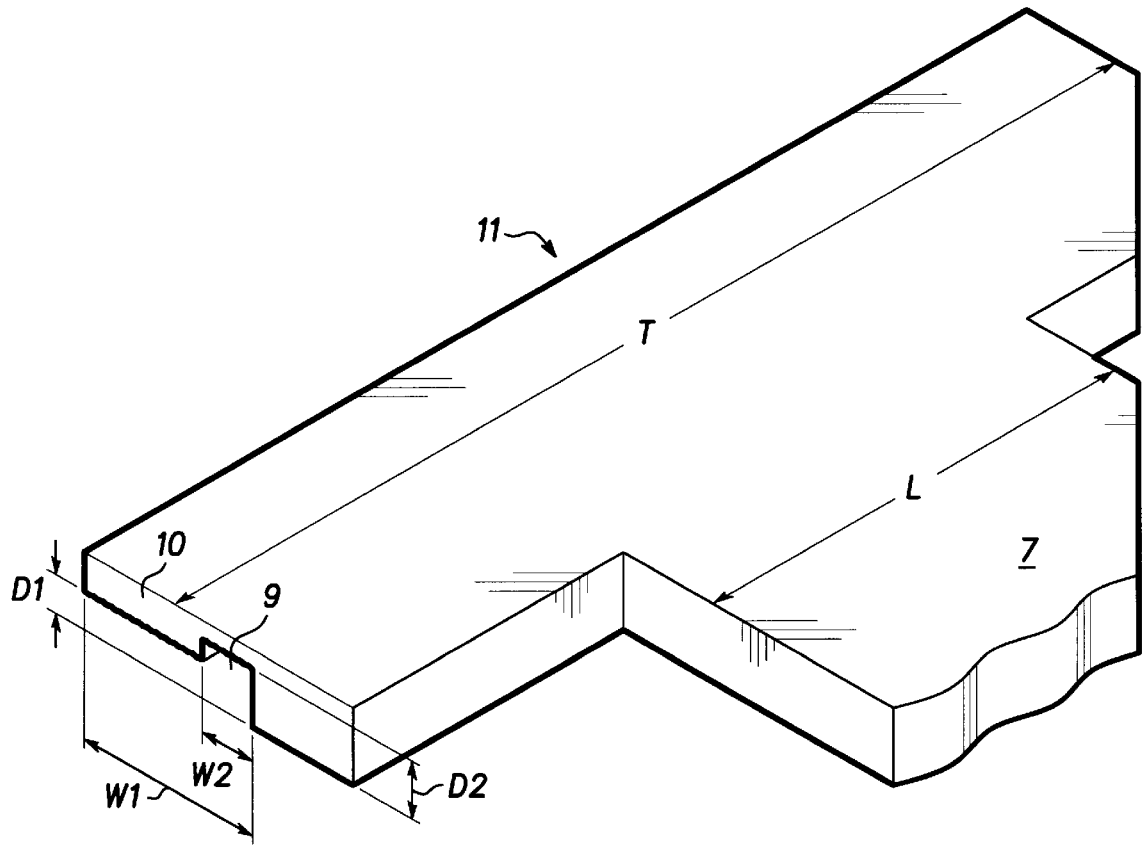
FIG. 10 shows the critical geometric parameters of the inner end of the lead of the embodiment of FIG. 3.

FIG. 10 shows the critical geometric parameters described above. They are defined as follows:

T is width of the T-lead structure 11 at the end of the lead portion 7;

L is the width of the elongate lead portion 7;

D1 is the reduction in thickness of the portion 10;

D2 is the depth of the channel 9;

W1 is the width of the portion 10 and channel 9; and

W2 is the width of the channel 9.

From the above definitions, it can be seen that the value (T−L) determines the locking effect parallel to the lead. In order to provide sufficient locking parallel to the lead, in the preferred embodiment, the value of D1 is desirably at least 0.15 mm (6 mils).

Depth D2 is preferably between 30% and 45% of the thickness of the leadframe and width W1 is preferably at least 60% of the length of the T-lead structure 11. Preferably, width W2 is between 50% and 60% of the value of width W1.

It will be appreciated that although only one particular embodiment of the invention has been described in detail, various modifications and improvements can be made by a person skilled in the art without departing from the scope of the present invention.

We claim:

1. A leadframe having at least one flag portion and at least one lead portion extending towards the flag portion, the lead portion including an elongate portion, an end portion adjacent the flag portion and an intermediate portion interconnecting the end portion and the elongate portion, the thickness of the end portion being less than the thickness of the elongate portion and the thickness of the intermediate portion being less than the thickness of the end portion.

2. A leadframe according to claim 1, wherein the end portion of the leadframe has a width greater than the elongate portion.

3. A leadframe according to claim 1, wherein the intermediate portion of the leadframe has a width greater than the elongate portion.

4. A leadframe according to claim 1, wherein the intermediate portion of the leadframe has a width substantially the same as the elongate portion.

5. A leadframe according to claim 1, wherein the elongate portion of the leadframe has a thickness substantially the same as that of the flag portion and is substantially coplanar therewith.

6. A leadframe according to claim 2, wherein the intermediate portion of the leadframe has a width greater than the elongate portion.

7. A leadframe according to claim 2, wherein the intermediate portion of the leadframe has a width substantially the same as the elongate portion.

* * * * *